(12) United States Patent
Wang

(10) Patent No.: US 10,985,052 B2
(45) Date of Patent: Apr. 20, 2021

(54) METHOD FOR CLEANING CONTACT HOLE

(71) Applicant: Silergy Semiconductor Technology (Hangzhou) LTD, Hangzhou (CN)

(72) Inventor: Huan Wang, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

(21) Appl. No.: 16/430,583

(22) Filed: Jun. 4, 2019

(65) Prior Publication Data
US 2019/0393081 A1 Dec. 26, 2019

(30) Foreign Application Priority Data

Jun. 20, 2018 (CN) .......................... 201810635829.7

(51) Int. Cl.
*H01L 21/768* (2006.01)
*H01L 21/02* (2006.01)

(52) U.S. Cl.
CPC .. *H01L 21/76814* (2013.01); *H01L 21/02063* (2013.01)

(58) Field of Classification Search
None
See application file for complete search history.

(56) References Cited

U.S. PATENT DOCUMENTS

| | | |
|---|---|---|
| 5,888,906 A | 3/1999 | Sandhu et al. |
| 6,020,254 A | 2/2000 | Taguwa |
| 6,232,239 B1 | 5/2001 | Lim et al. |
| 6,796,314 B1 | 9/2004 | Graff |
| 7,265,060 B2 | 9/2007 | Tsai et al. |
| 8,399,360 B1 | 3/2013 | Miller et al. |
| 8,962,490 B1 | 2/2015 | Hung et al. |
| 2003/0114010 A1 | 6/2003 | Jung |
| 2006/0183055 A1* | 8/2006 | O'Neill ............ H01L 21/02216 430/316 |
| 2007/0184996 A1* | 8/2007 | Weng ........................ C11D 7/08 510/175 |
| 2009/0011587 A1* | 1/2009 | Tsai .................. H01L 21/02063 438/592 |

FOREIGN PATENT DOCUMENTS

| | | |
|---|---|---|
| CN | 102148191 A | 8/2011 |
| CN | 107316807 A | 11/2017 |

* cited by examiner

*Primary Examiner* — Angel Roman
(74) *Attorney, Agent, or Firm* — Michael C. Stephens, Jr.

(57) ABSTRACT

A method of cleaning a contact hole of a semiconductor device, can include: removing a first portion of an object to be removed in the contact hole by a dry cleaning process, where a second portion of the object to be removed remains after the dry cleaning process has completed; and removing the second portion of the object to be removed by a wet cleaning process. The method can further include: forming an interlayer dielectric layer on a semiconductor substrate having a contact region; etching the interlayer dielectric layer to form the contact hole, where the contact hole penetrates the interlayer dielectric layer and exposes the contact region; and after the cleaning of the contact hole, filling the contact hole by a metal material to form a metal plug that is in contact with the contact region.

15 Claims, 6 Drawing Sheets

METHOD FOR CLEANING CONTACT HOLE

RELATED APPLICATIONS

This application claims the benefit of Chinese Patent Application No. 201810635829.7, filed on Jun. 20, 2018, which is incorporated herein by reference in its entirety.

FIELD OF THE INVENTION

The present invention generally relates to semiconductor devices and processes, and more particularly to methods of cleaning contact holes.

BACKGROUND

For semiconductor devices, the contact resistance typically accounts for a high proportion of the interconnect resistance, so it is important to reduce the contact resistance. During a standard semiconductor manufacturing process, there may be residual oxide in the bottom of the hole after the contact hole is formed, or natural oxide may be formed in the bottom of the contact hole in the waiting duration. These oxides can adversely affect the subsequent filling process of the contact hole, which can eventually result in a large or unstable contact resistance.

DETAILED DESCRIPTION

Figure 1:
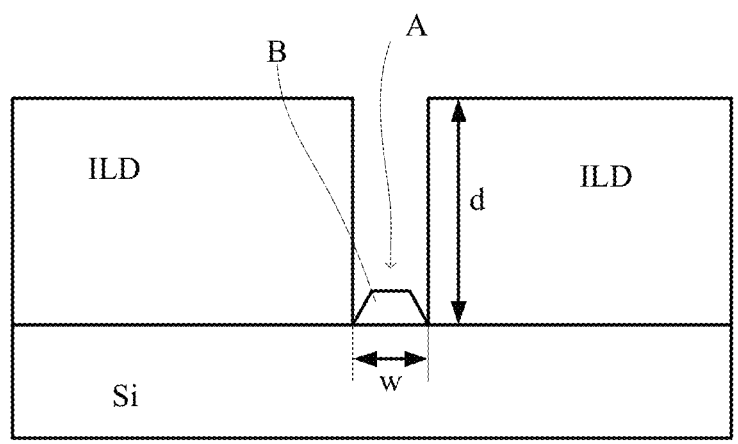
FIG. 1 is a cross-sectional diagram of an example object to be removed in a contact hole after the topography of the contact hole is formed.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Semiconductor devices are generally manufactured using two complex manufacturing processes: front-end manufacturing and back-end manufacturing. Front-end manufacturing may involve the formation of a plurality of die on the surface of a semiconductor wafer. Each die on the wafer may contain active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components can be formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist may be removed, leaving behind a patterned layer. Alternatively, some types of materials can be patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface may be used to produce smaller and more densely packed active and passive components. Planarization can be used to remove material from the surface of the wafer and produce a uniformly flat surface. Planarization can involve polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer may be singulated using a laser cutting tool or saw blade. After singulation, the individual die are mounted to a package substrate that includes pins or contact pads for interconnection with other system components. Contact pads formed over the semiconductor die can then be connected to contact pads within the package. The electrical connections can be made with solder bumps, stud bumps, conductive paste, or wire bonds, as a few examples. An encapsulant or other molding material may be deposited over the package to provide physical support and electrical isolation. The finished package can then be inserted into an electrical system and the functionality of the semiconductor device is made available to the other system components.

In one embodiment, a method of cleaning a contact hole of a semiconductor device, can include: (i) removing a first portion of an object to be removed in the contact hole by a dry cleaning process, where a second portion of the object to be removed remains after the dry cleaning process has completed; and (ii) removing the second portion of the object to be removed by a wet cleaning process. The method may further include: (i) forming an interlayer dielectric layer on a semiconductor substrate having a contact region; (ii) etching the interlayer dielectric layer to form the contact hole, where the contact hole penetrates the interlayer dielectric layer and exposes the contact region; and (iii) after the cleaning of the contact hole, filling the contact hole by a metal material to form a metal plug that is in contact with the contact region.

Figure 2:
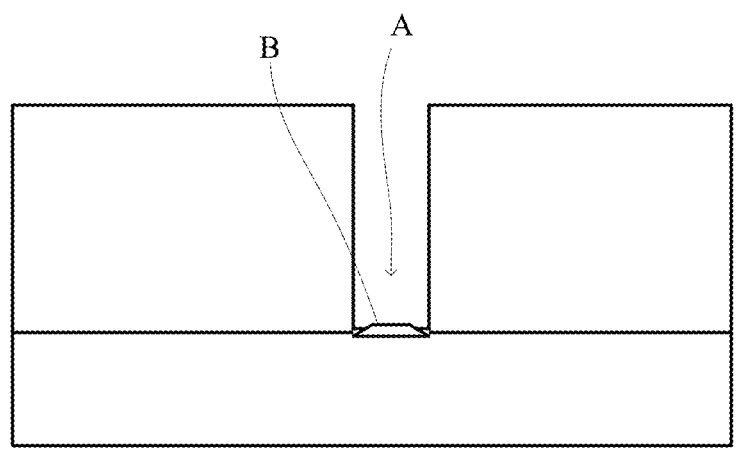
FIG. 2 is a cross-sectional diagram of an example contact hole after cleaning the contact hole by a dry cleaning process.

Referring now to FIG. 1, shown is a cross-sectional diagram of an example object to be removed in a contact hole after the topography of the contact hole is formed. Referring also to FIG. 2, shown is a cross-sectional diagram of an example contact hole after cleaning the contact hole by a dry cleaning process. After the contact hole is formed by etching process, it is necessary to clean the contact hole, in order to remove residual oxides or natural oxides in the contact hole. FIG. 1 shows one example cleaning process of a contact hole of a semiconductor device (e.g., a Si semiconductor device). In this case, a dry cleaning process, mainly by bombarding the oxide in the bottom of the contact hole with sputtered argon ions, may be utilized. However, the interlayer dielectric (ILD) layer on the semiconductor layer may be relatively thick, and the width of the contact hole needs to be relatively narrow, which makes the aspect ratio of contact hole A formed in dielectric layer ILD relatively high. If a dry cleaning process is used to clean oxide B in the bottom of contact hole A, the bottom of contact hole A may not be thoroughly cleaned, and a small amount of residual oxide B may remain, as shown in FIG. 2.

In order to clean contact holes that have a large aspect ratio, it may not be advisable to directly use a wet cleaning process instead of a dry cleaning process. This is because a wet cleaning process may have isotropic characteristics. Further, the cleaning time with a wet cleaning process may be too long. This can cause the surface topology of the contact hole to be changed, which can lead to adverse effects on the semiconductor devices.

Figure 3:
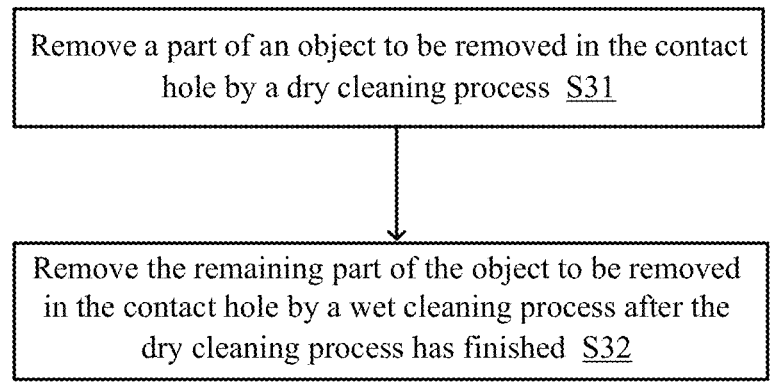
FIG. 3 is a flow diagram of an example method of cleaning a contact hole, in accordance with embodiments of the present invention.

Referring now to FIG. 3, shown is a flow diagram of an example method of cleaning a contact hole, in accordance with embodiments of the present invention. In this particular example, the cleaning method can include, at S31, removing a portion of an object to be removed in the contact hole by a dry cleaning process. In S31, the dry cleaning process may mainly use ion bombardment in order to bombard the bottom of contact hole A (see, e.g., FIG. 1) with a certain bombardment force. In this way, a relatively large portion of the object to be removed in contact hole A can be removed during the step. For example, if the total thickness of the object to be removed is h, and a first portion of the object to be removed is removed by the dry cleaning process, the thickness of the first portion of the object to be removed is h1. After the dry cleaning process has completed, the thickness of the remaining portion (second portion) of the object to be removed is h2 (see, e.g., B in FIG. 2). That is, the stack of the first and second portions in the depth direction of contact hole A may equal, e.g., B as shown in FIG. 1.

Thus, thickness h can be approximately the sum of thickness h1 and thickness h2. In order to prevent the cleaning solution from changing the topography of contact hole A during the subsequent wet cleaning process, thickness h1 may need to be larger than thickness h2. However, this may not be preferable the larger the ratio of thickness h1 to thickness h2, and these thicknesses h1 and h2 for the given cleaning processes may also need to consider the aspect ratio of contact hole A. As shown in FIG. 1, the aspect ratio refers to the ratio of depth d to width w of contact hole A. The larger the aspect ratio is, the smaller the ratio of thickness h1 to thickness h2 may need to be set.

For example, when the aspect ratio is a first ratio, if total thickness h of object to be removed B is substantially 100 Å, the dry cleaning process may be used to remove about 80 Å of the object to be removed. Thus, about 20 Å of the object to be removed may be removed in the subsequent wet cleaning process, and thickness h1 is approximately four times of thickness h2 in this case. When the aspect ratio is a second ratio greater than the first ratio, if total thickness h of the object to be removed is still substantially 100 Å, the dry cleaning process may be used to remove about 75 Å of the object to be removed. Thus, about 25 Å of the object to be removed may be removed in the subsequent wet cleaning process, and thickness h1 is approximately three times thickness h2 in this case.

In particular embodiments, as the aspect ratio varies in particular applications, thickness h1 can be set to be approximately 2 to 6 times of thickness h2, in order to obtain an improved cleaning effect. For example, an inert ion, such as Ar (argon) ions, may be used to bombard the bottom of contact hole A. During the bombardment process, a predetermined bombardment force may be required, and the predetermined bombardment force may not damage the bottom of the contact hole. Without damaging the bottom of the contact hole, the predetermined bombardment force can be set to be as large as possible.

If the object to be removed is oxide, and the oxide includes residual oxide remaining in the contact hole after the topography of the contact hole is formed and/or natural oxidation naturally growing in the waiting duration, at S32 in FIG. 3, after the dry cleaning process is finished, the remaining portion of the object to be removed in the contact hole can be removed by a wet cleaning process. The remaining portion removed in S32 is the second portion of the object to be removed having thickness h2, as described above. When the aspect ratio of the contact hole is relatively large, it may be difficult to clean all the object to be removed without damaging the bottom of the contact hole by dry cleaning process alone.

Therefore, in particular embodiments, a wet cleaning process may be combined with a dry cleaning process to remove all of the object that is desired to be removed. However, the wet cleaning process may have isotropic characteristics, and if the cleaning time is too long, the vertical surface topology of the contact hole can be changed. Therefore, thickness h2 of the second portion of the object to be removed, and which is removed by the wet cleaning process, may not be designated to be too thick. As such, thickness h2 may generally be less than about 40% of the total thickness of the object to be removed. For example, thickness h1 can be from about 2 to about 6 times of thickness h2, such that the duration of the wet cleaning process can be controlled to be less than about 45 seconds.

Figure 4:
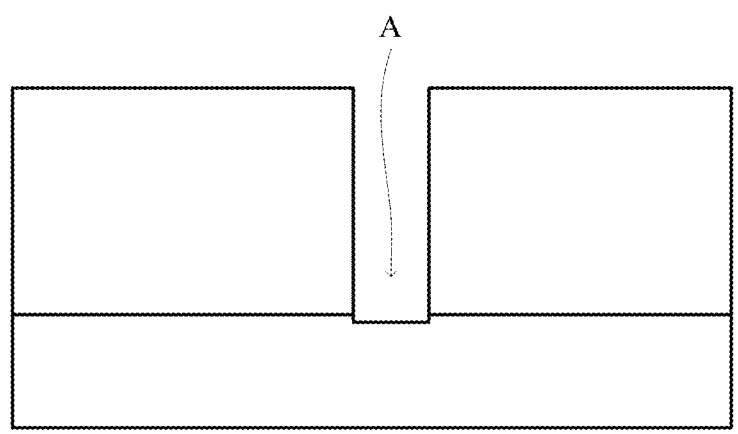
FIG. 4 is a cross-sectional diagram of a contact hole after cleaning the contact hole first a dry cleaning and then by a wet cleaning, in accordance with embodiments of the present invention.

Referring now to FIG. 4, shown is a cross-sectional diagram of a contact hole after cleaning the contact hole first a dry cleaning and then by a wet cleaning, in accordance with embodiments of the present invention. Here, the bottom of the contact hole may not be damaged during the dry cleaning process, and the vertical topography of the contact hole may not be changed during the wet cleaning process. For example, when the total thickness of the object to be removed is 100 Å, thickness h1 can be substantially 80 Å. Also, thickness h2 of the second portion of the object to be removed, and that is to be removed by the wet cleaning process, can be substantially 20 Å. A certain dilution ratio of hydrofluoric acid or buffered oxide etchant (BOE) may be used in order to remove the remaining portion of the object to be removed. The thickness h2 may be appropriately increased correspondingly when the aspect ratio of the contact hole is increased, it should be ensured that the wet cleaning time for removing the object to be removed is less than 45 seconds, in order to avoid possible contact hole surface topology changes.

Therefore, thickness h2 can also be set to be larger as the aspect ratio of the contact hole increases, but may not exceed a predetermined maximum thickness. The duration of the predetermined maximum thickness removed by the wet cleaning process may be within 45 seconds. For example, during the wet cleaning process, the higher the concentration of the cleaning solution used, the shorter the duration of the wet cleaning process. For example, 20 Å remaining the object to be removed can be removed by using 100:1 diluted hydrofluoric acid, may take about 30 seconds. When the concentration of hydrofluoric acid increases, the required wet cleaning time may be than 30 seconds, and vice versa greater than 30 seconds, but generally may not exceed 45 seconds.

In particular embodiments, cleaning the contact hole can include first using a dry cleaning process, and then using a wet cleaning process, to ensure that all the object that is desired to be removed in the contact hole may be thoroughly cleaned. It may be ensured that the bottom of the contact hole is not damaged during the dry cleaning process, and the vertical surface topology of the contact holes is not changed during the wet cleaning process, by adjusting the ratio of the thickness of the first portion removed by a dry cleaning process to the thickness of the second portion removed by a wet cleaning process.

Figure 5:
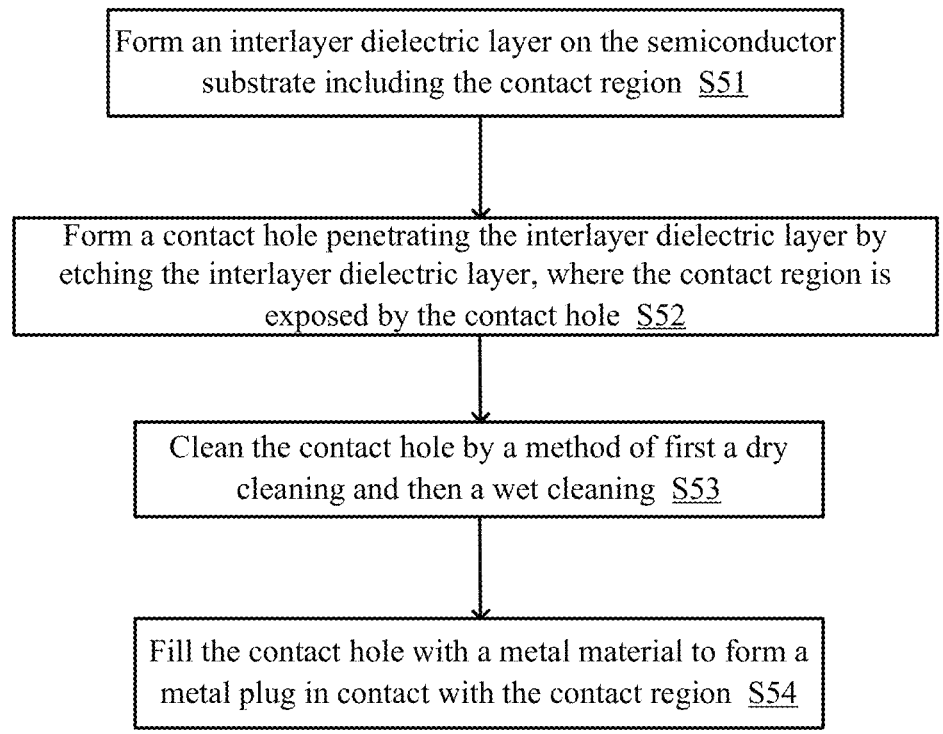
FIG. 5 is a flow diagram of an example method of forming a metal contact of a semiconductor device, in accordance with embodiments of the present invention.
Figure 6:
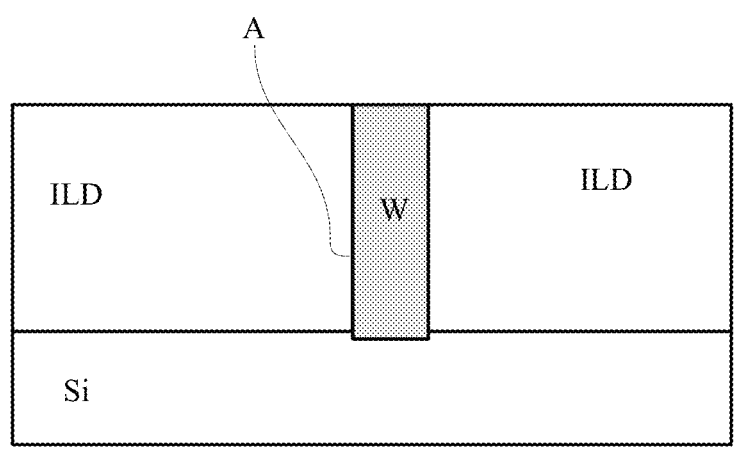
FIG. 6 is a cross-sectional diagram of an example metal contact of a semiconductor device, in accordance with embodiments of the present invention.

Referring now to FIG. 5, shown is a flow diagram of an example method of forming a metal contact of a semiconductor device, in accordance with embodiments of the present invention. Referring also to FIG. 6, shown is a cross-sectional diagram of an example metal contact of a semiconductor device, in accordance with embodiments of the present invention. At S51, an interlayer dielectric layer can be formed on the semiconductor substrate (e.g., Si) including the contact region. At least one contact region may be formed on the surface of substrate Si, and the contact region may include an N-type doped contact region and/or a P-type doped contact region. For example, interlayer dielectric layer ILD is SiO2, or other suitable dielectric materials.

At S52, a contact hole can be formed penetrating the interlayer dielectric layer by etching the interlayer dielectric layer, where the contact region on the semiconductor substrate may be exposed by the contact hole. To form the contact hole, a mask (e.g., a photoresist) may be provided on interlayer dielectric layer ILD, and a portion of interlayer dielectric layer ILD corresponding to the contact region can be exposed by the mask. The etching process may begin from the surface of interlayer dielectric layer ILD that is exposed by the mask, and can stop at the contact region of the surface of substrate Si to form contact hole A. After which, polymer may be removed in contact hole A to form a basic surface topography of contact hole A.

At S53, the contact hole can be cleaned by performing first a dry cleaning, and then performing a wet cleaning. After contact hole A is formed by an etching process, and the polymer in contact hole A is further removed, the surface topography of the contact hole may be formed. However, some residual oxide may remain in the bottom of the contact hole and/or natural oxide can be formed in the bottom of the contact hole during the wait time. Therefore, before filling the contact hole, the contact hole may need to be cleaned to remove the oxide, as discussed above.

At S54, the contact hole can be filled with a metal material to form a metal plug that is in contact with the contact region. After contact hole A is cleaned, the contact hole can be filled with metal material without further delay. Otherwise, natural oxide may be formed in the bottom of the contact hole during the delay time, whereby the contact performance between metal plug W and the contact region may suffer. In order to reduce the contact resistance between metal plug W and the contact region, between steps S53 and S54, a dopant with the same type as that of the contact region may be implanted into the contact region to increase the doping concentration of the surface of the contact region.

In forming a metal contact of a semiconductor device in particular embodiments, the residual oxide and/or the natural oxide in the contact hole may be thoroughly removed by first performing a dry cleaning, and then performing a wet cleaning, without damaging the bottom of the contact hole and changing the shape or surface topography of the contact hole. Therefore, the contact performance between the metal plug and the contact region can be improved, such that the semiconductor device has a lower contact resistance.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A method of cleaning a contact hole in a semiconductor device, the method comprising:
 a) forming the contact hole in an interlayer dielectric layer, wherein the contact hole extends a full depth of the interlayer dielectric layer;
 b) after the contact hole has been formed, removing a first portion of an object from in the contact hole by a dry cleaning process, wherein a second portion of the object to be removed remains after the dry cleaning process has completed, and wherein a first thickness of the first portion is greater than a second thickness of the second portion; and c) removing the second portion of the object by a wet cleaning process, d) wherein the dry and wet cleaning processes do not change the shape or surface topology of the contact hole once formed.

2. The method according to claim 1, wherein the larger the aspect ratio of the contact hole, the smaller the ratio of the first thickness to the second thickness.

3. The method according to claim 1, wherein the first portion and the second portion are stacked in the depth direction of the contact hole to constitute the object to be removed.

4. The method according to claim 1, wherein the first thickness is from about 2 to about 6 times the second thickness.

5. The method according to claim 1, wherein the higher the concentration of the cleaning solution used during the wet cleaning process, the shorter the duration of the wet cleaning process.

6. The method according to claim 5, wherein the duration of the wet cleaning process is controlled to be less than about 45 seconds.

7. The method according to claim 1, wherein the dry cleaning process comprises bombarding the bottom of the contact hole by ion bombardment with a predetermined bombardment force to remove part of the object to be removed without damaging the bottom of the contact hole.

8. The method according to claim 1, wherein the object to be removed comprises at least one of: residual oxide remaining in the contact hole after the topography of the contact hole is formed, and natural oxide naturally growing in the waiting duration.

9. The method of claim 1, further comprising:
a) forming the interlayer dielectric layer on a semiconductor substrate having a contact region;
b) etching the interlayer dielectric layer to form the contact hole, wherein the contact hole penetrates the interlayer dielectric layer and exposes the contact region; and
c) after the cleaning of the contact hole, filling the contact hole by a metal material to form a metal plug that is in contact with the contact region.

10. The method according to claim 9, wherein before the filling the metal hole, further comprising implanting a dopant of the same doping type as that of the contact region in the contact region to increase the doping concentration of the surface of the contact region.

11. The method according to claim 9, wherein before cleaning the contact hole, further comprising removing a polymer in the contact hole to form a basic topography of the contact hole.

12. The method according to claim 1, wherein the contact hole has a straight sidewall extending through the interlayer dielectric, and the straight sidewall is not changed due to the dry and wet cleaning processes.

13. The method according to claim 1, wherein the contact hole has a constant width through the interlayer dielectric, and the constant width is not changed due to the dry and wet cleaning processes.

14. The method according to claim 1, wherein the object comprises residual oxides in the contact hole.

15. The method according to claim 1, wherein the object comprises natural oxides in the contact hole.

* * * * *